(12) United States Patent
Siaud et al.

(10) Patent No.: US 11,522,003 B2
(45) Date of Patent: Dec. 6, 2022

(54) MATRIX-ARRAY DETECTOR WITH A PLURALITY OF GROUPS OF DRIVER MODULES ARE INTERLACED ACCORDING TO THE ORDER OF THE ROWS OF PIXELS AND METHOD FOR IMPLEMENTING THE DETECTOR

(71) Applicant: TRIXELL, Moirans (FR)

(72) Inventors: Martin Siaud, Moirans (FR); Simon Marecaux, Moirans (FR); Chantal Hordequin, Moirans (FR)

(73) Assignee: TRIXELL, Moirans (FR)

( * ) Notice: Subject to any disclaimer, the term of this patent is extended or adjusted under 35 U.S.C. 154(b) by 0 days.

(21) Appl. No.: 17/477,379

(22) Filed: Sep. 16, 2021

(65) Prior Publication Data

US 2022/0093672 A1 Mar. 24, 2022

(30) Foreign Application Priority Data

Sep. 18, 2020 (FR) ...................................... 2009457

(51) Int. Cl.
*H01L 27/146* (2006.01)
*H04N 5/376* (2011.01)

(52) U.S. Cl.
CPC .. *H01L 27/14641* (2013.01); *H01L 27/14607* (2013.01); *H04N 5/376* (2013.01)

(58) Field of Classification Search
CPC ........ H01L 27/14641; H01L 27/14607; H04N 5/376

USPC ..................................................... 250/214 R
See application file for complete search history.

(56) References Cited

U.S. PATENT DOCUMENTS

| 8,102,450 B2 * | 1/2012 | Masuyama | .......... H04N 5/3765 |
| | | | 250/214 R |
| 2014/0321618 A1 * | 10/2014 | Blanchon | ............... G01N 23/04 |
| | | | 378/91 |

FOREIGN PATENT DOCUMENTS

| EP | 1 781 015 A1 | 5/2007 |
| FR | 3 092 721 A1 | 8/2020 |
| WO | 2012/152836 A1 | 11/2012 |

* cited by examiner

*Primary Examiner* — Que Tan Le
*Assistant Examiner* — Mai Thi Ngoc Tran
(74) *Attorney, Agent, or Firm* — BakerHostetler

(57) ABSTRACT

A matrix-array detector and to a method for implementing the detector are provided. The detector includes an array of pixels that are sensitive to a physical effect and arranged in a matrix along rows and down columns, each pixel generating a signal according to the physical effect; row conductors, each allowing the pixels of one row to be driven; a first group of driver modules each delivering selection signals to one row conductor of a first group of row conductors; a second group of driver modules each delivering selection signals to one row conductor of a first group of row conductors; the first and second groups of row conductors being interlaced.

5 Claims, 8 Drawing Sheets

MATRIX-ARRAY DETECTOR WITH A PLURALITY OF GROUPS OF DRIVER MODULES ARE INTERLACED ACCORDING TO THE ORDER OF THE ROWS OF PIXELS AND METHOD FOR IMPLEMENTING THE DETECTOR

CROSS-REFERENCE TO RELATED APPLICATIONS

This application claims priority to foreign French patent application No. FR 2009457, filed on Sep. 18, 2020, the disclosure of which is incorporated by reference in its entirety.

FIELD OF THE INVENTION

The present invention relates to a matrix-array detector and to a method for implementing the detector. The invention is of use in producing visible images but is not limited to that field. It is for example possible to produce pressure or temperature maps or two-dimensional representations of chemical or electrical potentials. These maps or representations form images of physical quantities. The invention applies in particular to active matrix-array detectors used for example for detection purposes in imaging devices employing ionizing radiation, for example x-rays, such as TFT plates, where TFT stands for "thin-film transistor".

BACKGROUND

In a matrix-array detector, a pixel represents the basic sensitive element of the detector. Each pixel converts a physical effect to which it is subjected into an electrical signal. The electrical signals from the various pixels are collected in a matrix-array read phase then digitized so as to be able to be processed and stored to form an image. The pixels are formed by a zone sensitive to the physical effect and deliver a current of electric charges, for example. The physical effect may be electromagnetic radiation delivering a stream of photons and, consequently, the invention will be explained by means of this type of radiation and the charge current is dependent on the stream of photons received by the sensitive zone. Generalizing to any matrix-array detector is straightforward.

A matrix-array image detector comprises row conductors, each connecting the pixels of one and the same row, and column conductors, each connecting the pixels of one and the same column. The column conductors are connected to converter circuits that are generally arranged at an edge of the matrix array, which may be referred to as the "foot of the column".

Each pixel generally comprises a photosensitive element, or photodetector, which may for example be a photodiode, a photoresistor or a phototransistor. There are photosensitive matrix arrays of large size which may have several millions of pixels arranged in rows and columns. Each pixel further consists of an electronic circuit consisting, for example, of switches, capacitors and resistors, downstream of which there is an actuator. The assembly consisting of the photosensitive element and the electronic circuit allows electric charges to be generated and collected. The electronic circuit generally allows the charge collected in each pixel to be reset after a charge transfer. The role of the actuator is to transfer or copy the charges collected by the circuit into a column conductor. This transfer is performed when the actuator receives the instruction to do so from a row conductor. The output of the actuator corresponds to the output of the pixel. The terms "row conductor" and "column conductor" are completely arbitrary. It is of course possible to switch these terms.

In this type of detector, a pixel operates in two phases: an image capture phase, in which the electronic circuit of the pixel accumulates the electric charges generated by the photosensitive element, and a read phase, in which the collected charges are transferred or copied into the column conductor by the actuator.

In the read phase, a read instruction is transmitted to all of the actuators of one and the same row of the matrix array by a row conductor. Each of the pixels in this row is read by transferring its electrical information, e.g. charge, voltage, current, frequency, etc. to the column conductor with which it is associated.

For one image frame, the rows of pixels may be selected sequentially, one after the other, in a direction of scanning the rows of the matrix array over a row selection time corresponding to a fraction of the frame duration, allowing appropriate signals, for example voltages, to be applied to the pixels of the row in question. Thus, selecting a row corresponds to applying, for a corresponding row selection time, a high-level signal controlling the on state of the switching devices of the corresponding row of pixels. Outside of the row selection time, the switching devices are kept in an off state by applying a suitable low-level signal. For example, when the switching devices are transistors, and the signals to be applied are then voltages, it is common practice to use VGon to denote the voltage corresponding to the high level and therefore to the on state of the switching transistor, and VGoff to denote the voltage corresponding to the low level and to the off state of the switching transistor.

The rows can be controlled by control circuits comprising one or more shift registers in series, each of the shift registers comprising a plurality of cascaded stages, each stage being suitable for switching the high and low levels of the signal applied to the actuators for the pixels of a corresponding row of the matrix array according to the sequencing of the row selection operation, for example vertical scanning. The control circuits may be implemented in integrated circuits, one and the same integrated circuit being able, for example, to have a plurality of control circuits for a plurality of rows in the matrix array. The integrated circuits may, for example, be external to the matrix array, and be connected thereto by wired means, for example by flexible ribbon cables. The control circuits may also be installed on the plate bearing the pixels as described in patent application WO 2012/152836 A1 filed in the name of the applicant.

This makes it possible to decrease the number of signals applied to the plate and hence the size and number of flexible connectors used to connect the plate to its surrounding electronics. This integrated control circuit architecture constitutes an appreciable simplification of the detector architecture by decreasing the number of components and simplifying the manufacturing process.

However, this architecture dictates the order in which the matrix rows are driven. This order is dictated by the connections of the control circuits and of the matrix rows. In some cases, it may be desirable to vary the order in which the matrix rows are controlled. More specifically, it may be desirable to group together a plurality of pixels in order to read them out collectively. This grouping together, known in the literature as "binning", allows the signal-to-noise ratio of each element read out to be improved. Another advantage of grouping together pixels is improved detector sensitivity. However, grouping together negatively affects spatial resolution.

In the case in which the information from each pixel is an electric charge, the grouping together of pixels can be achieved by redistributing the charges from the pixels to be grouped together over a common capacitor, for example arranged in the converter circuit at the foot of the column. This can be achieved in a detector such as described in patent application WO 2012/152836 A1 by reading out each row of pixels successively. However, in such a detector, the grouping together of pixels of consecutive rows does not make it possible to improve the detector readout speed and therefore to increase the frequency of the images produced by the detector.

SUMMARY OF THE INVENTION

The invention aims to overcome all or some of the problems mentioned above by providing a detector the control circuits of which allow either conventional sequential readout or grouping together of pixels belonging to successive rows, increasing readout speed. The invention is particularly advantageous in a detector in which the control circuits and the pixels are produced on one and the same substrate.

To this end, one object of the invention is a matrix-array detector comprising:
  an array of pixels that are sensitive to a physical effect and arranged in a matrix along rows and down columns of pixels, each pixel generating a signal according to the physical effect, the rows of pixels being ordered physically;
  row conductors, each allowing the pixels of one row to be driven;
  driver modules each associated with one row conductor (L), the driver modules each delivering selection signals to one of the row conductors, the driver modules being distributed in a plurality of groups that are interlaced according to the order of the rows of pixels, in which the driver modules of each group are chained to one another in the physical order of the rows that are associated with the groups of driver modules in question, the chaining of each of the groups of driver modules being independent of the chaining of the one or more other groups of driver modules.

Advantageously, the matrix-array detector further comprises a module for generating a plurality of tokens each delivered to an input of a first of the driver modules of each group of driver modules, in each of the groups of driver modules, an output of each module being connected to an input of the module of higher rank, the driver modules being ordered in each of their groups in the order of the rows of pixels to the conductor of which the driver module in question delivers the selection signal.

Advantageously, the pixels and the driver modules are produced on one and the same substrate on the basis of only n-type thin-film transistors or of only p-type thin-film transistors.

Another subject of the invention is a method for using a matrix-array detector according to the invention, in which driver modules belonging to distinct groups and connected to consecutive row conductors may receive simultaneous control signals so as to drive the consecutive rows simultaneously or alternate control signals so as to drive the consecutive rows separately.

BRIEF DESCRIPTION OF THE DRAWING

The invention will be understood better and further advantages will become apparent from reading the detailed description of an embodiment given by way of example, this description being illustrated by the appended drawing, in which.

For the sake of clarity, the same elements will bear the same references in the various figures.

DETAILED DESCRIPTION

The following description is provided with reference to a matrix-array detector comprising a plurality of elementary electronic circuits referred to as pixels, each comprising an element that is sensitive to a physical quantity. The elementary electronic circuits are, in the example described, pixels that are sensitive to light radiation. It is clear that the invention may be implemented for other detectors sensitive to any form of physical quantity, allowing for example pressure or temperature maps to be produced.

Figure 1:
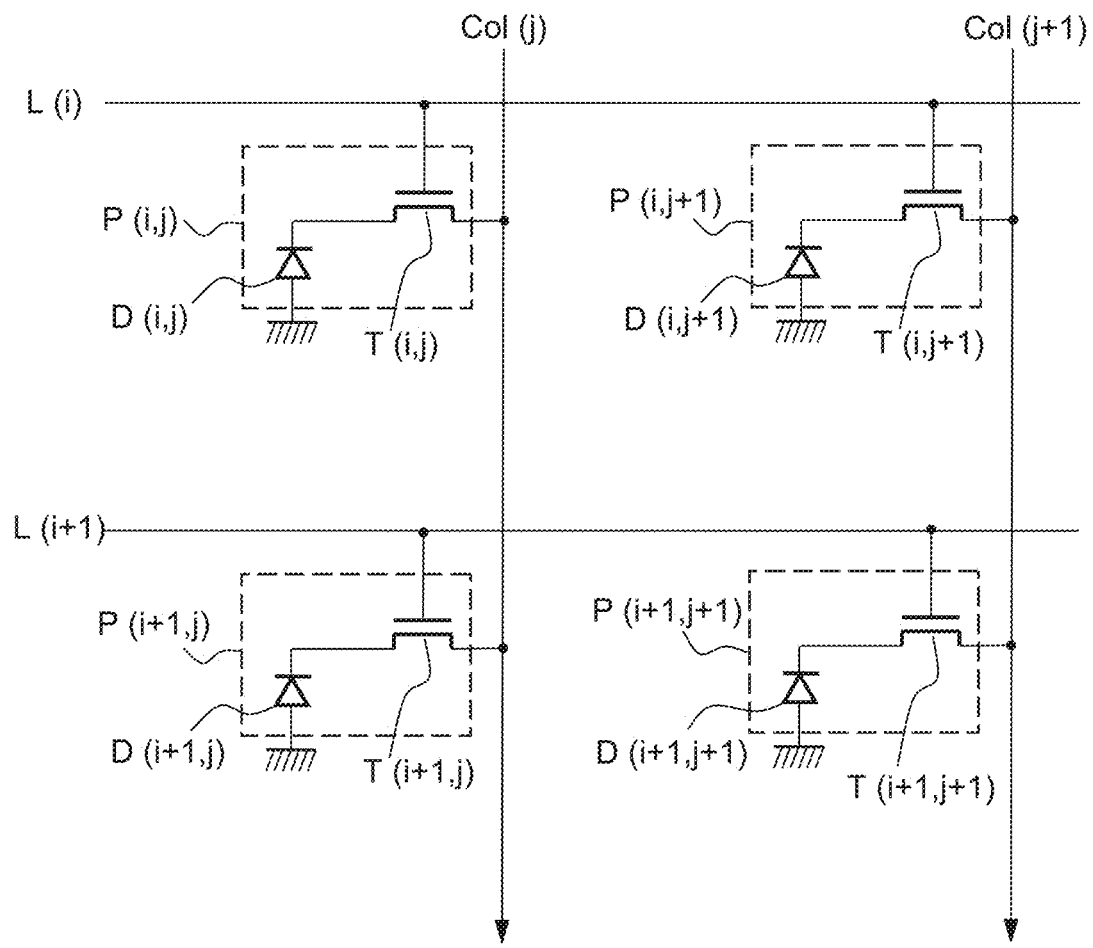
FIG. 1 shows an exemplary matrix-array of pixels that can be implemented in a detector according to the invention.

FIG. 1 schematically shows the detection zone 10 of a matrix-array detector. This zone comprises a matrix of two rows and two columns to facilitate understanding. Four pixels P are formed, each at the intersection of one row and one column. Of course, actual matrix arrays are generally much larger and feature a large number of rows and columns. The matrix array of pixels belongs to a matrix-array detector 12 allowing digitized images to be produced.

Each pixel P comprises a photosensitive zone, represented here by a photodiode D, and an electronic processing circuit formed, in the example of FIG. 1, by a single transistor T. The references for the components D and T are followed by two coordinates specifying the rank of the row, i and i+1, respectively, and that of the column, j and j+1, respectively. The rows and columns are ordered in the physical order that they occupy in the matrix array of pixels. The pixels shown are also known as 1T pixels since they each possess one transistor, the function of which will be described further below.

In general, it is common practice to produce matrix arrays of pixels comprising thin-film field-effect transistors, known as TFTs for "thin-film transistors". TFTs may be based on metal oxides such as for example transistors based on amorphous or crystalline indium, gallium and zinc oxide, which are known by the abbreviation IGZO. Other families of TFTs may be employed such as for example organic TFTs, amorphous silicon TFTs or polycrystalline silicon TFTs. In this last type of TFT, some have been synthesized at low temperature. They are known by the acronym LTPS for "low-temperature polycrystalline silicon".

The pixels P of one and the same column are connected to a column conductor Col. This conductor allows information from the pixels connected thereto to be collected. The pixels P of one and the same row are connected to a row conductor L carrying a signal VG allowing the corresponding row of pixels to be controlled.

In an image capture phase, which takes place after a reset operation, the illumination received by the photodiode D decreases the potential of its cathode. This image capture phase is followed by a read phase in which the potential of the photodiode D is read. To do this, the transistor T is turned on, which therefore acts as a switch controlled by the control signal VG applied to its gate.

The column conductor Col is used to collect information from a pixel in the corresponding column when it is selected by the signal VG.

It is possible to implement the invention in a detector in which the pixels are simpler, in particular by replacing the transistor T with a simple diode which is turned on by the signal VG. It is also possible to implement the invention in a detector in which the pixels comprise a plurality of transistors. In particular, it is known practice to implement 3T pixels comprising, in addition to the read transistor described above, a reset transistor for the photodiode and a follower transistor. In this type of 3T pixel, a second row conductor carries a reset signal allowing the reset transistor to be controlled.

Figure 2:
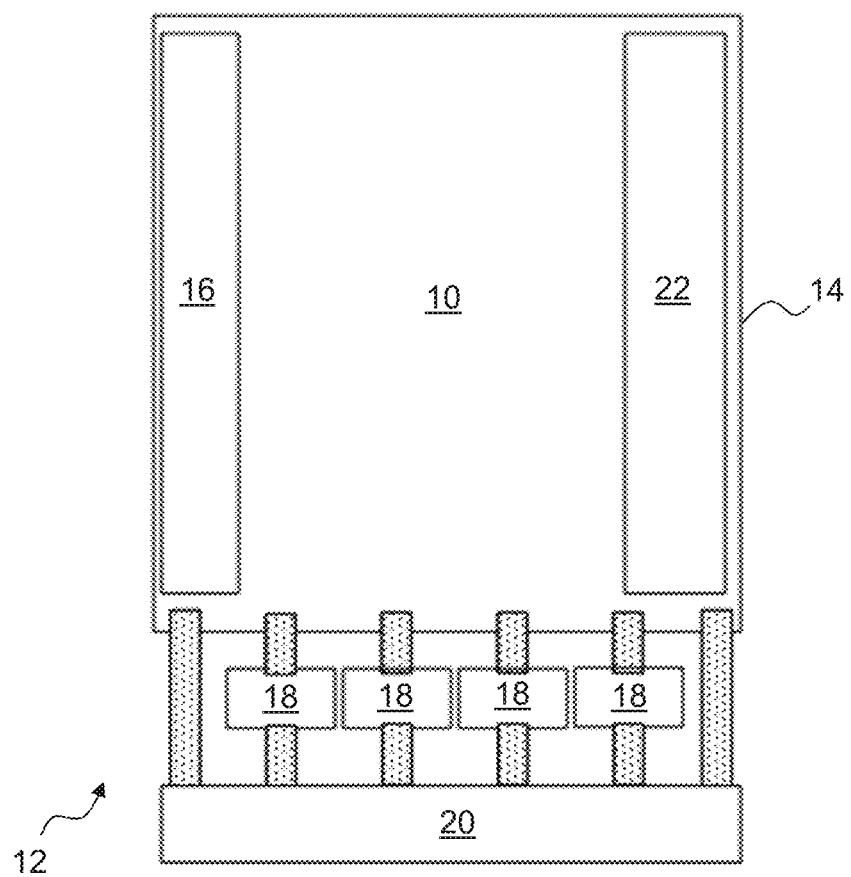
FIG. 2 shows an exemplary detector according to the invention.

FIG. 2 schematically shows the overall detector 12. The detector 12 comprises a plate 14 forming the substrate on which the components of the detection zone 10 are produced. Driver modules 16 delivering control signals to all of the row conductors L are arranged on this same plate 14. Alternatively, the driver modules 16 may be produced on a substrate distinct from the plate 14. However, producing the driver modules 16 on the same substrate as the pixel P makes it possible to limit the connections connecting the plate 14 to its surroundings.

The detector 12 comprises read circuits 18 that are connected to the column conductors Col. The read circuits 18 are generally produced on substrates distinct from the plate 14. The read circuits 18 are connected to the plate 14 by means of ribbon cables.

The detector 12 comprises a circuit 20 allowing the driver modules 16 to be driven and allowing the signals from the read circuits 18 to be retrieved, in particular in order to multiplex them.

Figure 3:
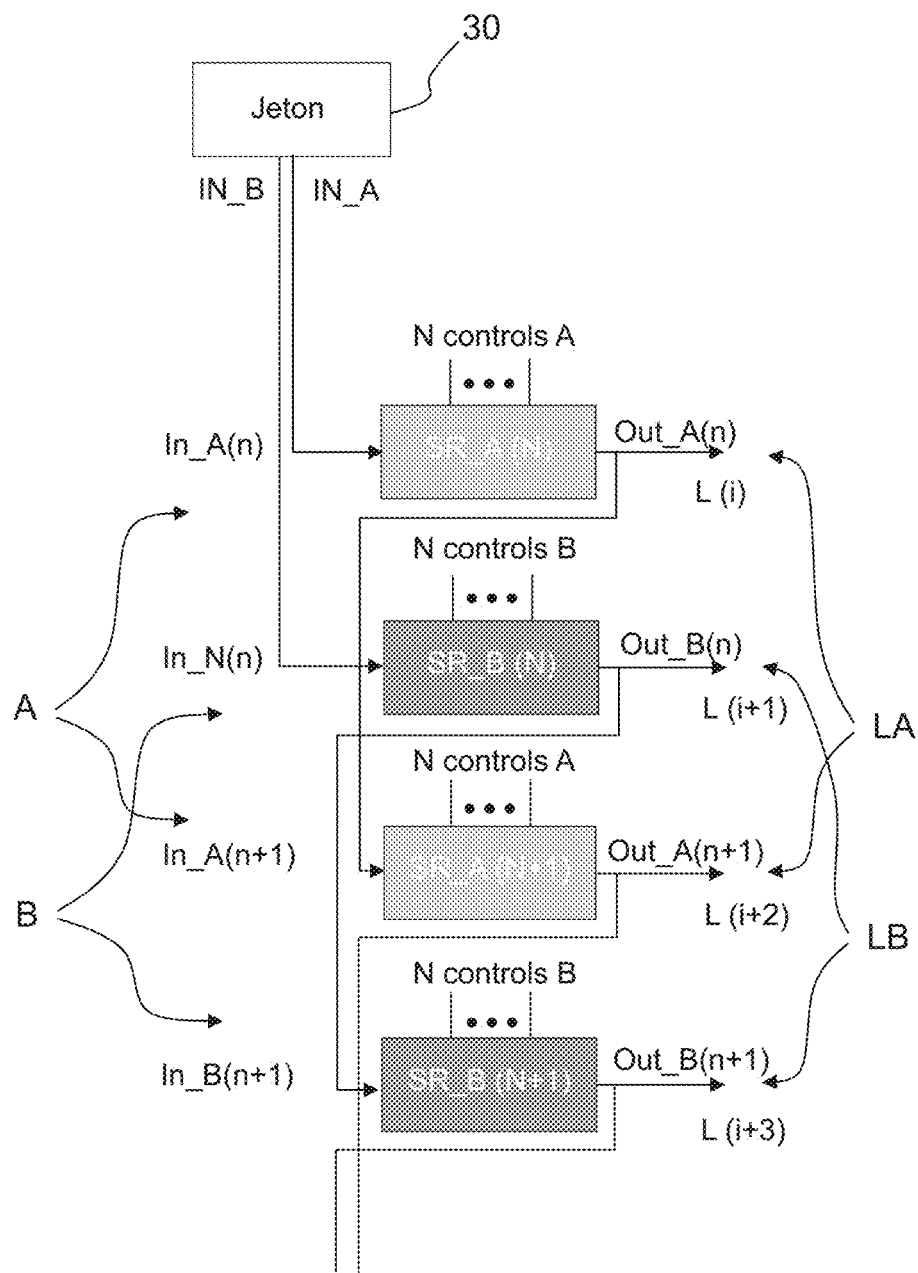
FIG. 3 shows one exemplary embodiment of a plurality of driver modules that can be implemented in the detector of FIG. 2.

FIG. 3 shows a first exemplary embodiment of four driver modules 16, each being configured to drive a row of pixels. It is clearly understood that the invention may be implemented for a greater number of rows of pixels. More specifically, the output Out_A(n) of the first driver module, denoted by SR_A(N), is connected to a row conductor L(i) conveying a readout signal VG for the row i. The output Out_B(n) of the second driver module, denoted by SR_B (N), is connected to a row conductor L(i+1) conveying a readout signal VG for the row i+1. The output Out_A(n+1) of the third driver module, denoted by SR_A(N+1), is connected to a row conductor L(i+2) conveying a readout signal VG for the row i+2. The output Out_B(n+1) of the fourth driver module, denoted by SR_B(N+1), is connected to a row conductor L(i+3) conveying a readout signal VG for the row i+3. The rows and the driver modules are ordered in the order of FIG. 3. More specifically, in the case of individual readout of each of the rows of pixels, the row i is read out, followed by the row i+1, then the row i+2 and finally the row i+3. As will be seen further on, the driver modules are configured to also allow readout by grouping together the rows in successive pairs.

In the example shown, the driver modules are distributed in two groups, SR_A(N) and SR_A(N+1) in a first group A and SR_B(N) and SR_B(N+1) in a second group B. The invention may be implemented with a greater number of groups of driver modules. The rows are also grouped together into two groups: LA for the rows L(i) and L(i+2) on the one hand and LB for the rows L(i+1) and L(i+3) on the other hand. The driver module group A is associated with the rows of the group LA and the driver module group B is associated with the rows of the group LB. The groups of rows LA and LB and therefore the groups of driver modules A and B are interlaced. More specifically, in each group, the driver modules are ordered following the physical order of the rows of the matrix array. For two groups of driver modules A and B, in the physical order of the rows of the matrix array, the first driver module of the first group A: SR_A(1) drives the first row L(1) of the matrix array. The first driver module of the second group B: SR_B(1) drives the second row L(2). The second driver module of the first group A: SR_A(2) drives the third row L(4). The second driver module of the second group B: SR_B(2) drives the fourth row L(1) and so on until the last row of the matrix array. More generally, with K groups of driver modules, using the following notation:

i: the rank of a current row in the physical order of the rows of the matrix array, j: the rank of the module in its group k: the rank of the group between 1 and K the row i is driven by the module of rank j of the group of rank k with:

$$i=(j-1)K+k$$

Distributing the rows and the driver modules in various groups associated with one another makes it possible to drive the groups of rows differently and in particular with adaptation of the synchronization of the various groups of driver modules and therefore with adaptation of the synchronization of the driving of the groups of rows.

FIG. 3 shows one embodiment allowing particularly simple connection of the driver modules. It is clearly understood that other connections are possible. Each driver module comprises an input, respectively, In_A(n), In_B(n), In_A(n+1), In_B(n+1) making it possible to receive a command for the module in question and an output making it possible to drive the associated row, respectively, Out_A(n), Out_B(n), Out_A(n+1), Out_B(n+1). In each group, the driver modules are chained to one another in the order of the rows associated with the groups in question. The chaining of one group is independent of the chaining of the one or more other groups of driver modules. More specifically, in the example shown, the output Out_A(n) is connected to the input In_A(n+1) and the output Out_B(n) is connected to the input In_B(n+1).

The detector 12 comprises a generation module 30 making it possible to generate a first token IN_A delivered to the input of the first driver module SR_A(N) of the group A. The generation module 30 also makes it possible to generate a second token IN_B delivered to the input of the first driver module SR_B(N) of the group B. The chaining of the driver modules makes it possible for the token to travel from one driver module to the next in one and the same group. More generally, the generation module 30 makes it possible to generate as many tokens as there are groups of driver modules.

Additionally, the driver modules receive one or more control signals N controls A for the group A and N controls B for the group B. These control signals are, for example, clocks at the rate of which the tokens pass from one module to the other in one and the same group. The control signals may be generated by the generation module 30 which may be arranged on the plate 14 or on a substrate separate from the plate 14, for example in the circuit 20. The connections between the various driver modules for the control signals and the connections from the outputs to the inputs between consecutive modules may be made on the plate 14 and therefore do not require external connections.

The detector 12 may operate in various ways, either by generating the signals VG of each row sequentially in the order of the rows of the matrix array, which allows individual readout of the pixels of the detector 12, or simultaneously in two driver modules of the same rank in the two groups. In other words, the signals VG are transmitted simultaneously by the driver modules SR_A(N) and SR_B(N) and then by the driver modules SR_A(N+1) and SR_B(N+1), which allows the grouping together of the information originating from pixels of different rows. The choice between the two types of detector readout, either individual or per group of pixels, is made by varying the times of transmission of the tokens IN_A and IN_B and potentially of the driver module control signals. Simultaneous transmission of the two tokens allows readout per group. Alternate transmission of the two tokens allows individual readout.

By distributing the driver modules in two groups, it is possible to group together the readout of two rows of pixels. More generally, K groups make it possible to group together the readout of K rows. Groupings of rows in submultiples of the number of groups is also possible. For example, with four groups of driver modules, it is possible read out the matrix array individually, per group of two rows or per group of four rows according to offsets in the transmission of the tokens for the various groups and the corresponding control signals.

Figure 4:
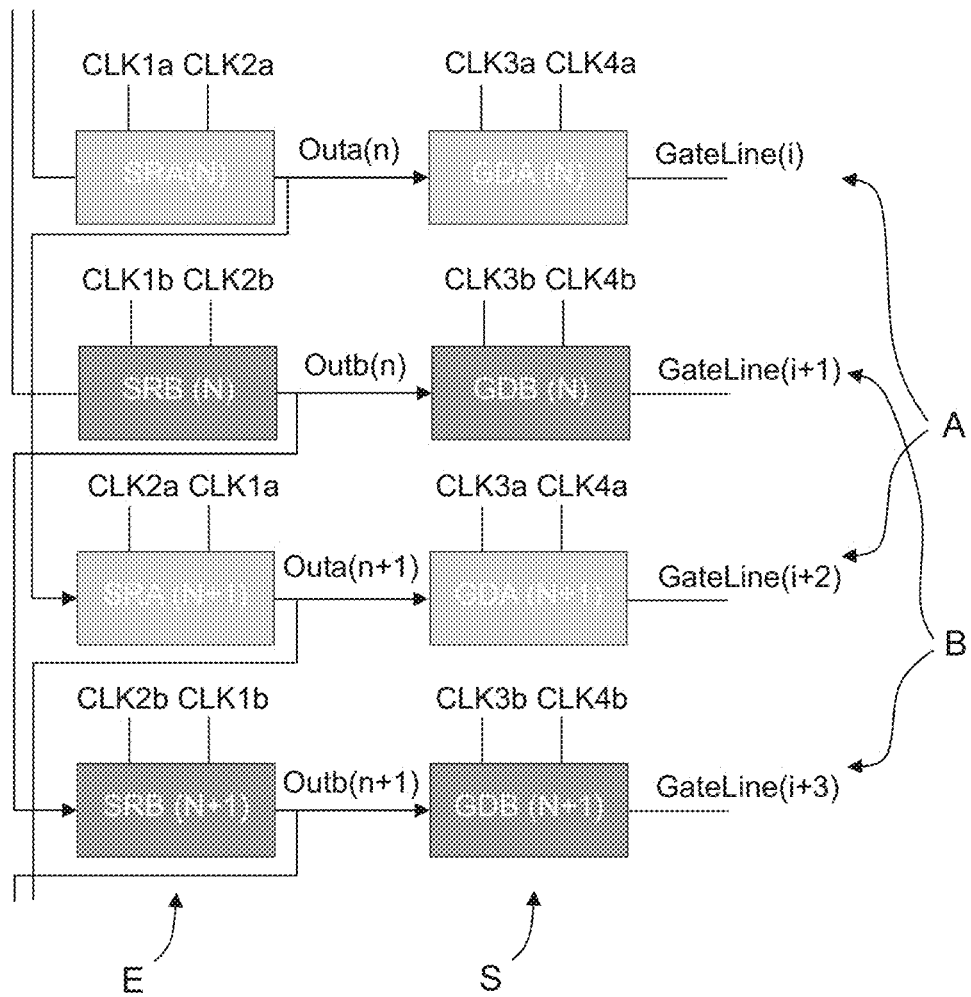
FIG. 4 shows another exemplary embodiment of a plurality of driver modules that can be implemented in the detector of FIG. 2.

FIG. 4 shows another exemplary embodiment of four driver modules 16, each being configured to drive a row of pixels. In this example, each driver module comprises an input stage E and an output stage S. The input stage E delivers an activation signal Outa or Outb for the corresponding output stage S. In the event of activation by the input stage, the corresponding output stage transmits the output signal for the driver module denoted here by Gate-line. This example with two stages corresponds to the scheme described in patent application WO 2012/152836 A1 mentioned above. The transmission of the token between two successive driver modules of one and the same group is achieved by means of the activation signal transmitted to the input of the input stage of the module of higher rank. The input stages of the various modules and their connection allowing the transmission of the token form a shift register. Each output stage forms an amplifier allowing the activation signal to be adapted to the characteristics of the signal VG.

Figure 5:
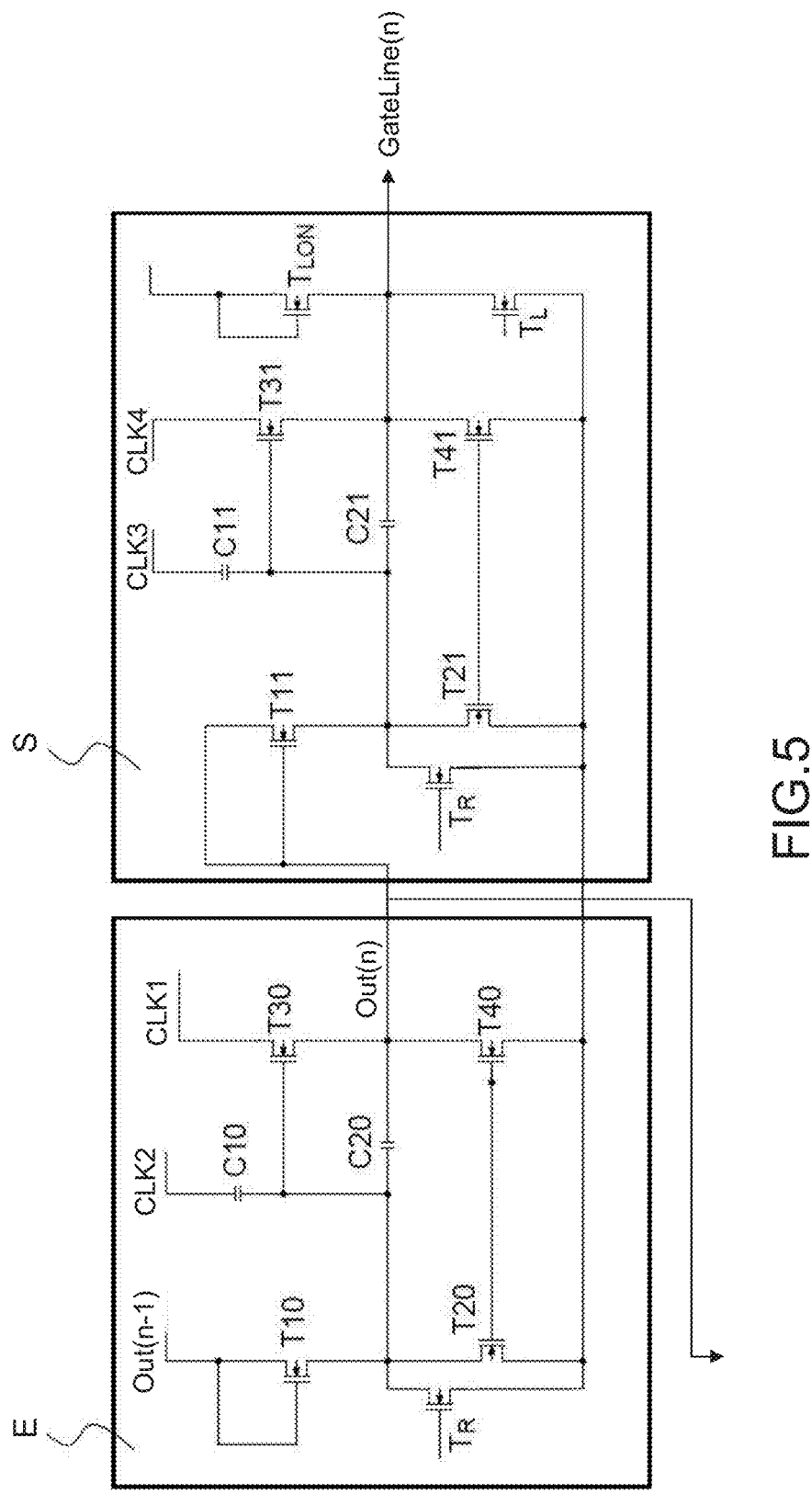
FIG. 5 shows a detailed example of a driver module of FIG. 4.

FIG. 5 shows a diagram of one of the driver modules of FIG. 4 in greater detail. The integrated structure forming a row-addressing device according to the present invention may essentially comprise transistors TFT of a single type, i.e. of p-type or of n-type, n-type being preferred for its better performance. Thus, all of the transistors described hereinafter may be thin-film transistors (TFTs) of a single, n- or p-, type.

The structure illustrated by FIG. 5 corresponds to one advantageous embodiment in which each stage n of the row-addressing device comprises an input stage 50 and an output stage 51. For a stage n of the row-addressing device, each of the input and output stages 50, 51 comprises, for example, most of the elements included in a row-addressing stage n as described above with reference to FIG. 3. It should be noted that, in the exemplary embodiments described, each row n of the matrix array is associated with a stage n of the addressing device. It is possible however, in alternative examples not described by the figures, to envisage row-addressing device structures in which a given stage controls a plurality of rows, or else in which some rows are not controlled by a stage.

Thus, the input stage 50 for a stage n of the row-addressing device may be formed by a shift register comprising an output row that renders an activation signal Out(n) as output. The input stage 50 may comprise an output transistor for the input stage T30, which transmits a pulse of a clock signal at the activation output Out(n). The gate of the output transistor for the input stage T30 may be connected to an internal node of the input stage of the row-addressing device, its source may be connected to the activation output Out(n) and its drain may receive the signal from a first clock CLK1. A boost capacitor for the input stage C20 may be connected between the gate and the source of the output transistor for the input stage T30. A first control transistor for the input stage T10 is capable of precharging the gate of the output transistor for the input stage T30. The source of the first control transistor for the input stage T10 is thus connected to the gate of the output transistor for the input stage T30. The gate and the drain of the first control transistor for the input stage T10 are controlled by the activation output Out(n−1) for the stage n−1 of the addressing device for the preceding row n−1.

A second control transistor for the input stage T20 is capable of discharging the gate of the output transistor for the input stage T30. The drain of the second control transistor for the input stage T20 is thus connected to the gate of the output transistor for the input stage T30. A compensation capacitor for the input stage C10 may advantageously be arranged between the signal from a second clock CLK2, in phase opposition with the signal from the first clock CLK1.

Advantageously, a discharge transistor for the input stage T40 may be connected to the activation output Out(n) for the input stage 50 for the stage n of the row-addressing device. The gate of the discharge transistor for the input stage T40 is connected to the gate of the second control transistor for the input stage T20; it is also connected to the activation output signal Out(n+1) for the next stage n+1.

Similarly, the output stage 51 for a stage n of the row-addressing device may be formed by a shift register comprising an output row that renders a signal Sn as output. The output stage 51 may comprise an output transistor for the output stage T31, which transmits a pulse of a clock signal at the output Sn. The gate of the output transistor T31 may be connected to an internal node of the stage of the row-addressing device, its source may be connected to the output Sn and its drain may receive the signal from a third clock CLK3. A boost capacitor for the output stage C21 may be connected between the gate and the source of the output transistor for the output stage T31. A first control transistor for the output stage T11 is capable of precharging the gate of the output transistor for the output stage T31. The source of the first control transistor for the output stage T11 is thus connected to the gate of the output transistor for the output stage T31. The gate and the drain of the first control transistor for the output stage T11 are controlled by the activation output Out(n) for the input stage 50 of the stage n of the addressing device.

A second control transistor for the output stage T21 is capable of discharging the gate of the output transistor for the output stage T31. The drain of the second control transistor for the output stage T21 is thus connected to the gate of the output transistor for the output stage T31. A compensation capacitor for the output stage C11 may advantageously be arranged between the signal from a fourth clock CLK4, in phase opposition with the signal from the third clock CLK3. A particularity of the third and fourth clocks CLK3, CLK4 is that their duty cycles may be different, and that the sum of their respective periods at their high level corresponds to the period of the first and second clocks CLK1, CLK2.

Advantageously, a discharge transistor for the output stage T41 may be connected to the output Sn of the output stage 51 of the stage n of the row-addressing device, delivering the activation signal for the row n. The gate of the discharge transistor for the output stage T41 is connected to the gate of the second control transistor for the output stage T21, it is also connected to the activation output Out(n+1) for the next stage n+1.

According to another specific feature of the present invention, the input stage 50 also comprises a reset transistor for the input stage TR, the gate of which is controlled by a pulse of a reset signal. The source of the reset transistor for the input stage TR may be connected to the sources of the second control transistor for the input stage T20. The drain of the reset transistor for the input stage TR may be connected to the drain of the second control transistor for the input stage T20.

In the same way, the output stage 51 also comprises a reset transistor for the output stage TR, the gate of which, as well as the gate of the reset transistor for the input stage, is controlled by a pulse of the reset signal. The source of the reset transistor for the output stage TR may be connected to the sources, respectively, of the second control transistor for the output stage T21 and of the discharge transistor for the output stage T41, as well as to the sources, respectively, of the second control transistor for the input stage T20 and of the discharge transistor for the input stage T40. The drain of the reset transistor for the output stage TR may be connected to the drain of the second control transistor for the input stage T21.

Thus, a reset pulse makes it possible to impose the off state on the various transistors in the input 50 and output 51 stages.

Additionally, the output stage 51 may comprise a row reset transistor TL. The row reset transistor TL is controlled via its gate by a specific signal. The drain of the row reset transistor TL is connected to the source of the output transistor for the output stage T31. The source of the row reset transistor TL may be connected to the sources of the transistors T20, T40, T21 and T41. The row reset transistor TL for a stage n makes it possible to force the voltage on the row n to the low state. The row reset transistor TL makes it possible to control the voltage on the rows, i.e. with respect to the outputs of the output stages of the stages, and to apply a low-impedance voltage thereto, in particular during "dead times". Specifically, in a typical manner, the driving of X-ray detectors, for example, comprises a reset phase, followed by a phase of applying the X-rays or "X-window", and then a readout phase. During the X-window, the X-rays are transformed into electrons in the photodiodes; the duration of the X-window is relatively long, typically up to 3.2 seconds, thus the row reset transistor TL makes it possible to avoid any drift in the matrix array.

Advantageously again, each output stage 51 may comprise a matrix-array reset switch, for example formed by a matrix-array reset transistor TLON making it possible to perform a complete reset of the matrix array. The matrix-array reset transistor TLON may be controlled by a matrix-array reset signal applied to its gate and to its drain. The source of the matrix-array reset transistor TLON may be connected to the source of the output transistor for the output stage T31. The matrix-array reset signal controlling the matrix-array reset transistor TLON may be the voltage VGoff or the activation voltage VGon. When the matrix-array reset transistor TLON is active, i.e. when the activation voltage VGon is applied, the activation voltage is then applied to the entirety of the matrix array.

In practice, a complete reset of the matrix array may be performed according to the sequence defined by activation of the matrix-array reset transistors TLON for a sufficient duration, followed by activation of the row reset transistors TL making it possible to place the rows back at the voltage VGoff.

Figure 6:
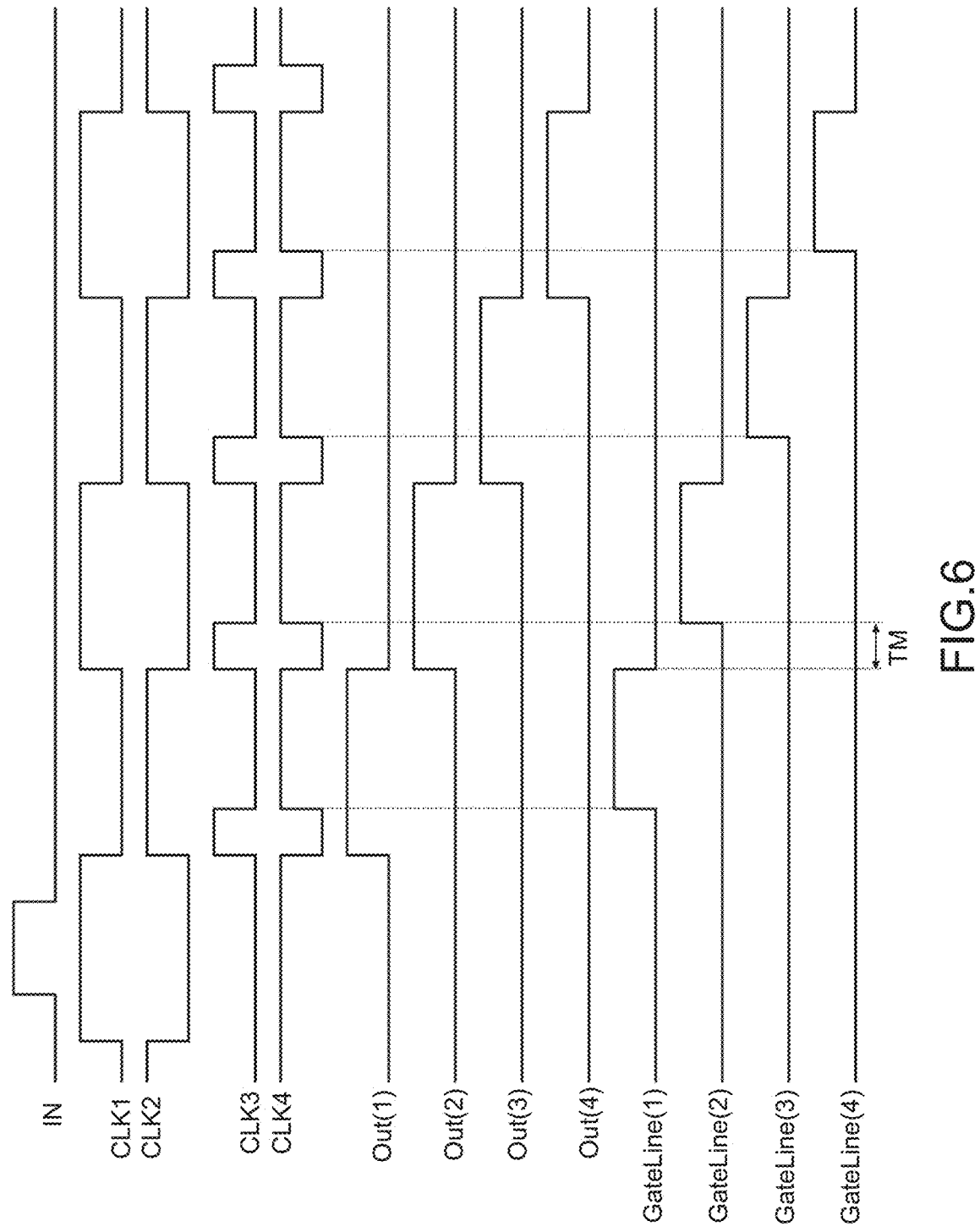
FIG. 6 shows, in the form of a timing diagram, an example of operation of a detector implementing driver modules as shown in FIG. 5 and chained in just one group.

FIG. 6 illustrates, in the form of a timing diagram, the operation of driver modules of FIG. 5 arranged in a single group, as described in patent application WO 2012/152836 A1. A single token IN is transmitted to the gate and the drain of the control transistor T10 for the input stage E of the first driver module. The clocks CLK1 and CLK2 are in phase opposition, with an equal share of the high and low levels. The clocks CLK3 and CLK4 are also in phase opposition with a cycle time that is half of the cycle time of the clocks CLK1 and CLK2. The duration of the high level of the clock CLK4 is longer than that of the clock CLK3.

FIG. 6 also shows the signal Out(n) for four consecutive rows. Each signal Out(n) is offset by a half-cycle of the clock CLK1 with respect to the one before. The signal Gateline(n) is also shown for the same four rows. A dead time TM is observed between two high levels of two consecutive signals Gateline. This dead time corresponds to the duration of the high level of the clock CLK3. A minimum duration of the high level of the clock CLK3 is necessary to ensure the charging of the gate of the transistor T31. By directly chaining the driver modules in a single group, it is impossible to eliminate this dead time.

Conversely, by distributing the driver modules in a plurality of groups, for individual readout of the pixels, it is possible to mask the dead time between two consecutive modules of one and the same group with the high level of a signal Gateline of another group.

Figure 7:
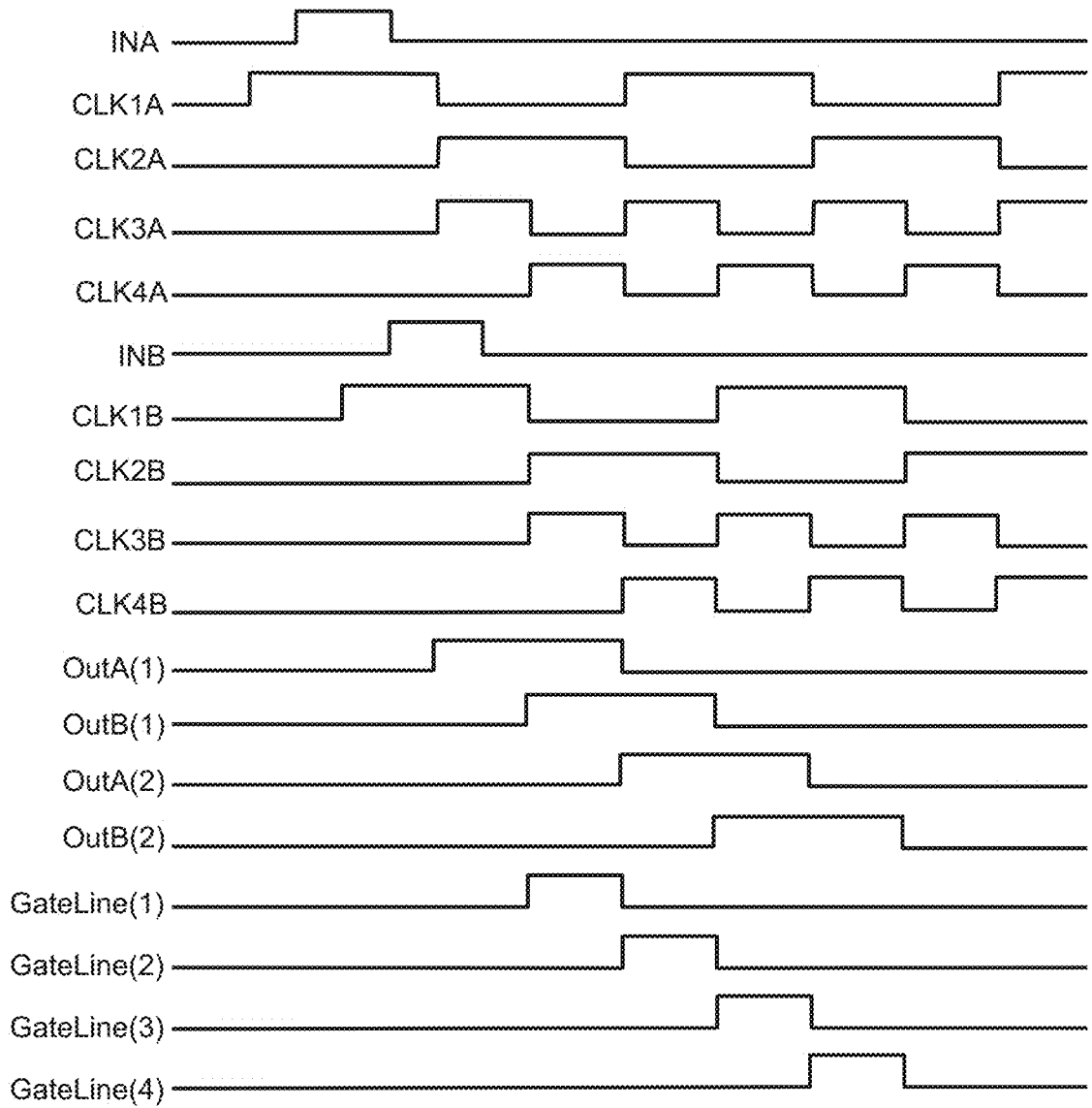
FIG. 7 shows, in the form of a timing diagram, an example of operation of a detector implementing driver modules as shown in FIG. 5 and chained in two groups for individual readout of the pixels of the detector.

FIG. 7 illustrates, in the form of a timing diagram, one example of operation of the detector 12 implementing driver modules as shown in FIG. 5 and chained in two groups for individual readout of the pixels of the detector. For the first group A, there is the token INA and the four clocks CLK1A, CLK2A, CLK3A and CLK4A. The clocks CLK1A, CLK2A are in phase opposition. The clocks CLK3A and CLK4A are also in phase opposition with a cycle time that is half of the cycle time of the clocks CLK1 and CLK2. Unlike the clocks described with FIG. 6, the four clocks CLK1A, CLK2A, CLK3A and CLK4A have an equal share of their respective high and low level.

In FIG. 7, the token INB and the four clocks CLK1B, CLK2B, CLK3B and CLK4B are are also shown for the group B. With respect to the group A, the signals of the group B are offset by a quarter of a cycle of clock CLK1A.

For the group A, two signals OutA(1) and OutA(2) and two signals Gateline(1) and Gateline(3) correspond to two consecutive driver modules of the group A. The signals Gateline(1) and Gateline(3) make it possible to drive the rows of rank 1 and 3 of the matrix array. Likewise for the group B, two signals OutB(1) and OutB(2) and two signals Gateline(2) and Gateline(4) correspond to two consecutive driver modules of the group B. The signals Gateline(2) and Gateline(4) make it possible to drive the rows of rank 2 and 4 of the matrix array. In other words, the driver modules of the group A generate the signals Gateline for the odd rows and the driver modules of the group B generate the signals Gateline for the even rows of the matrix array.

The interlacing of the two groups makes it possible to extend the duration of the high level of the clock CLK3A. It is thus possible to ensure the charging of the gate of the transistor T31 without a dead time between two consecutive rows. Specifically, the gate of the transistor T31 of a driver module of the group A is being charged during the high level of a signal Gateline of the group B.

Figure 8:
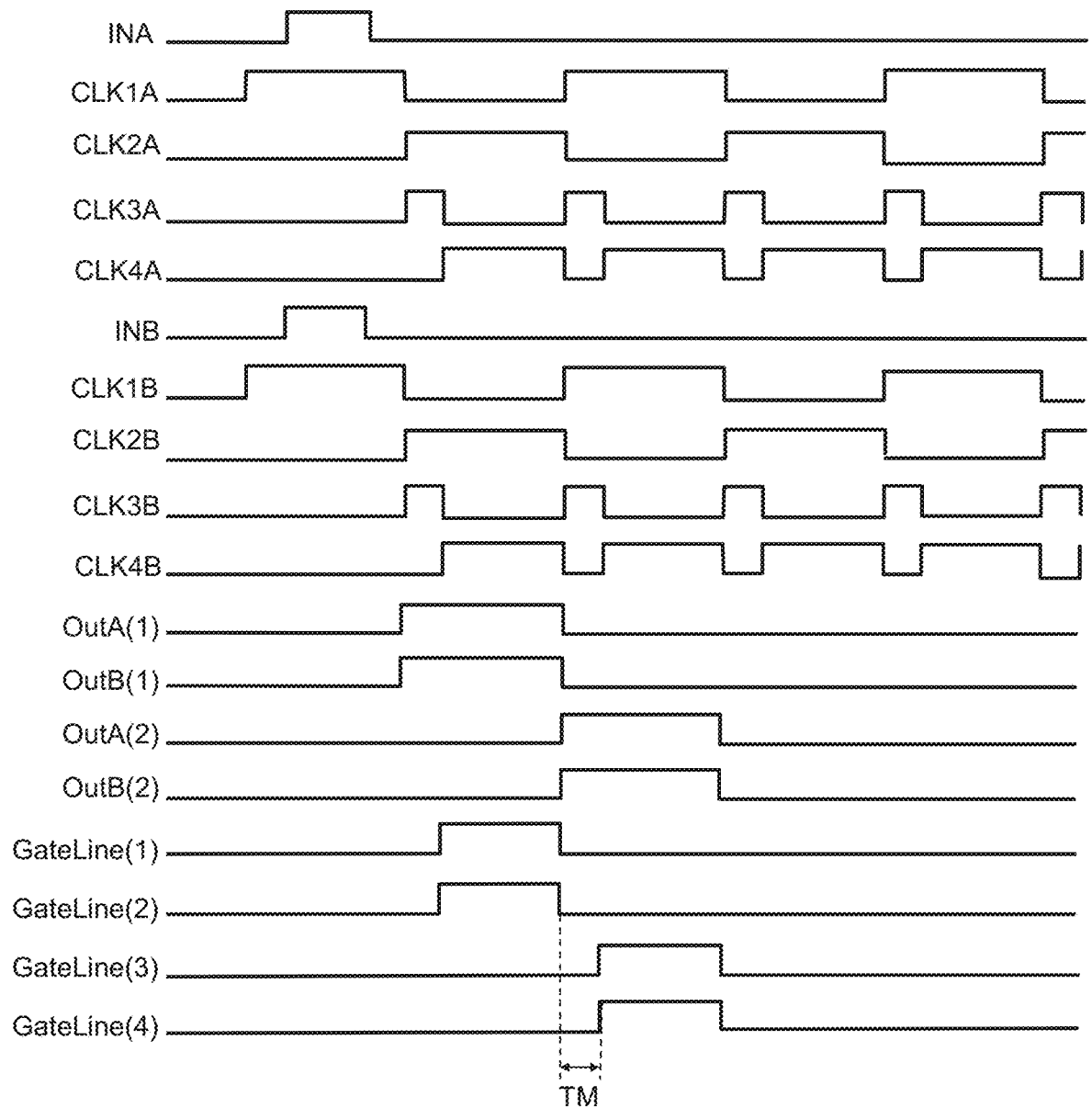
FIG. 8 shows, in the form of a timing diagram, an example of operation of a detector implementing driver modules as shown in FIG. 5 and chained in two groups for common readout of pixels of two consecutive rows.

FIG. 8 illustrates, in the form of a timing diagram, another example of operation of a detector 12 implementing driver modules as shown in FIG. 5, still chained in two groups and this time for common readout of pixels of consecutive rows. In other words, a consecutive even row and odd row are read out simultaneously. in the operation described with the aid of FIG. 8, the token INA is transmitted simultaneously with the token INB. Likewise, the clocks CLK1A, CLK2A, CLK3A and CLK4A are transmitted simultaneously with the corresponding clocks CLK1B, CLK2B, CLK3B and CLK4B. It follows therefrom that the signals OutA(1) and OutA(2), OutA(3) and OutA(4), Gateline(1) and Gateline (2), Gateline(3) and Gateline(4) are simultaneous.

The operation of FIG. 8 is similar to the operation of FIG. 6 with a dead time TM between the signals Gateline(2) and Gateline(3). To limit the duration of this dead time, the duration of the high level of the clocks CLK3A and CLK3B is shorter than the duration of the low level of these same clocks.

The detector 12, equipped with a plurality of groups of driver modules chained to one another, makes it possible to choose various modes of operation as needed, in particular individual readout of the pixels of the matrix array while affording the possibility of eliminating any dead time between two readouts of two consecutive rows of the matrix array. The detector 12 also makes it possible to group together the signals originating from a plurality of pixels in order to read them out collectively.

The two examples of operation are given for the readout of the matrix array of pixels P. in the diagram of FIG. 1, the row conductors L are used to drive the opening of a transistor T (i,j). This transistor is used both for the readout and for the resetting of each pixel P (i,j). It is possible to drive the pixels in the same way or differently for readout and for resetting, for example, individual readout and collective resetting.

The invention claimed is:

1. A matrix-array detector comprising:
an array of pixels that are sensitive to a physical effect and arranged in a matrix along rows and down columns of pixels, each pixel generating a signal according to the physical effect, the rows of pixels being ordered physically;
row conductors, each allowing the pixels of one row to be driven;
driver modules, each associated with one row conductor, the driver modules each delivering selection signals to one of the row conductors, the driver modules being distributed in a plurality of groups that are interlaced according to the order of the rows of pixels,
wherein the driver modules of each group are chained to one another in the physical order of the rows that are associated with the groups of driver modules in question, the chaining of each of the groups of driver modules being independent of the chaining of the one or more other groups of driver modules.

2. The matrix-array detector according to claim 1, further comprising a module for generating a plurality of tokens each delivered to an input of a first of the driver modules of each group of driver modules, in each of the groups of driver modules, an output of each module being connected to an input of the module of higher rank, the driver modules being ordered in each of their groups in the order of the rows of pixels to the conductor of which the driver module in question delivers the selection signal.

3. The matrix-array detector according to claim 1, wherein the pixels and the driver modules are produced on one and the same substrate on the basis of only n-type thin-film transistors or of only p-type thin-film transistors.

4. The matrix-array detector according to claim 2, wherein the pixels and the driver modules are produced on one and the same substrate on the basis of only n-type thin-film transistors or of only p-type thin-film transistors.

5. A method for using a matrix-array detector comprising:
an array of pixels that are sensitive to a physical effect and arranged in a matrix along rows and down columns of pixels, each pixel generating a signal according to the physical effect, the rows of pixels being ordered physically;
row conductors, each allowing the pixels of one row to be driven;
driver modules, each associated with one row conductor, the driver modules each delivering selection signals to one of the row conductors, the driver modules being distributed in a plurality of groups that are interlaced according to the order of the rows of pixels,
the driver modules of each group being chained to one another in the physical order of the rows that are associated with the groups of driver modules in question, the chaining of each of the groups of driver modules being independent of the chaining of the one or more other groups of driver modules
wherein driver modules belonging to distinct groups and connected to consecutive row conductors may receive simultaneous control signals so as to drive the consecutive rows simultaneously or alternate control signals so as to drive the consecutive rows separately.

* * * * *